United States Patent
Satoh et al.

(10) Patent No.: US 8,884,827 B2
(45) Date of Patent: Nov. 11, 2014

(54) ANTENNA UNIT AND ELECTRIC APPARATUS INCLUDING THE SAME

(75) Inventors: Keisuke Satoh, Osaka (JP); Hiroki Tanaka, Osaka (JP); Eiji Suematsu, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 784 days.

(21) Appl. No.: 13/103,308

(22) Filed: May 9, 2011

(65) Prior Publication Data

US 2012/0044113 A1 Feb. 23, 2012

(30) Foreign Application Priority Data

Aug. 18, 2010 (JP) ................... 2010-183101

(51) Int. Cl.
| | | |
|---|---|---|
| *H01Q 1/24* | (2006.01) | |
| *H01Q 1/06* | (2006.01) | |
| *H01Q 13/10* | (2006.01) | |
| *H01Q 1/38* | (2006.01) | |
| *H01Q 9/04* | (2006.01) | |

(52) U.S. Cl.
CPC ............... *H01Q 9/0407* (2013.01); *H01Q 1/06* (2013.01); *H01Q 13/10* (2013.01); *H01Q 1/38* (2013.01)
USPC .......................................... 343/702; 343/701

(58) Field of Classification Search
USPC ....................................................... 343/702
See application file for complete search history.

(56) References Cited

U.S. PATENT DOCUMENTS

| | | |
|---|---|---|
| 2002/0041254 A1 | 4/2002 | Nakano et al. |
| 2004/0174314 A1* | 9/2004 | Brown .......................... 343/767 |
| 2007/0182640 A1* | 8/2007 | Oohira ................... 343/700 MS |
| 2011/0057853 A1* | 3/2011 | Kim et al. ..................... 343/843 |

FOREIGN PATENT DOCUMENTS

| | | |
|---|---|---|
| JP | 6-29723 A | 2/1994 |
| JP | 9-252217 A | 9/1997 |
| JP | 9-298501 A | 11/1997 |
| JP | 2001-244716 A | 9/2001 |
| JP | 2001-292025 A | 10/2001 |
| JP | 2002-111366 A | 4/2002 |
| JP | 2002-152069 A | 5/2002 |
| JP | 2004-39764 A | 2/2004 |
| TW | 526623 B | 4/2003 |

* cited by examiner

*Primary Examiner* — Matthew Mikels
(74) *Attorney, Agent, or Firm* — Birch, Stewart, Kolasch & Birch, LLP

(57) ABSTRACT

An antenna unit includes a substrate (120), an antenna (110) located on one major surface of the substrate (120), a dielectric plate (130) opposed to the major surface of the substrate (120), and a dielectric layer (190) interposed between the substrate (120) and the dielectric plate (130). The dielectric plate (130) has a dielectric constant of not more than the dielectric constant of the substrate (120). The dielectric layer (190) has a dielectric constant smaller than the dielectric constant of the dielectric plate (130).

13 Claims, 12 Drawing Sheets

FIG.16

| GAP g (μm) | ANTENNA GAIN (dBi) |
|---|---|
| 0 | 7.14 |
| 100 | 7.75 |
| 200 | 7.86 |
| 300 | 7.95 |
| 400 | 7.99 |
| 600 | 7.83 |
| 800 | 7.59 |

FIG.17

| GAP g (μm) | ANTENNA GAIN (dBi) |
|---|---|
| 0 | 7.80 |
| 100 | 8.30 |
| 200 | 8.50 |
| 300 | 8.60 |
| 400 | 8.40 |
| 600 | 8.30 |
| 800 | 8.10 |

| STRUCTURE | ANTENNA GAIN (dBi) |
|---|---|
| PROVIDED WITH NO DIELECTRIC PLATE | 4.5 |
| PROVIDED WITH DIELECTRIC PLATE | 7.0 |
| PROVIDED WITH DIELECTRIC PLATE, COLUMNAR PROTRUSION | 8.0 |
| PROVIDED WITH DIELECTRIC PLATE, SQUARE POLE PROTRUSION | 8.60 |

ANTENNA UNIT AND ELECTRIC APPARATUS INCLUDING THE SAME

This nonprovisional application is based on Japanese Patent Application No. 2010-183101 filed on Aug. 18, 2010 with the Japan Patent Office, the entire contents of which are hereby incorporated by reference.

BACKGROUND OF THE INVENTION

1. Field of the Invention

The present invention relates to an antenna unit and an electric apparatus including the same.

2. Description of the Background Art

Japanese Patent Laying-Open No. 6-29723 (1994) discloses a planar antenna formed on one major surface of a substrate. In the planar antenna described in Japanese Patent Laying-Open No. 6-29723, an outer high-k dielectric layer and an inner low-k dielectric layer each having a thickness of a quarter effective wavelength are stacked on a microstrip antenna (MSA). According to this structure, input impedance in an outer space as viewed from a radiating element is increased to amplify incident power, thereby widening the band of the antenna.

While the band of the planar antenna described in Japanese Patent Laying-Open No. 6-29723 can be widened as a circuit, however, the high-k dielectric layer is arranged outside the planar antenna radiating radio waves, and hence binding between the high-k dielectric layer and a grounding conductor is strengthened. Consequently, radiation of the radio waves is disturbed due to insufficient consistency between the planar antenna and the ambient air, and hence the gain and the radiation efficiency of the antenna are substantially reduced.

SUMMARY OF THE INVENTION

An object of the present invention is to provide an antenna unit and an electric apparatus including the same, each capable of improving the gain and the radiation efficiency of an antenna.

The antenna unit according to the present invention includes a substrate, an antenna located on one major surface of the substrate, a dielectric plate opposed to the major surface of the substrate, and a dielectric layer interposed between the substrate and the dielectric plate. The dielectric plate has a dielectric constant of not more than the dielectric constant of the substrate. The dielectric layer has a dielectric constant smaller than the dielectric constant of the dielectric plate.

According to a mode of the present invention, the dielectric layer is made of a gas. Alternatively, the dielectric layer is constituted of resin.

Preferably, the dielectric layer is made of air, and the antenna unit satisfies the relation of $0.7\ \lambda/2 \leq S \leq 1.3\ \lambda/2$, assuming that $\lambda$ represents the wavelength of a high-frequency signal, radiated from the antenna, propagated in the air and S represents the distance between the major surface of the substrate and the dielectric plate opposed to each other.

According to another mode of the present invention, the antenna unit satisfies the relation of $0.4\ \lambda/(4\ \epsilon r^{1/2}) \leq d \leq 1.6\ \lambda/(4\ \epsilon r^{1/2})$, assuming that d represents the thickness of the dielectric plate and $\epsilon r$ represents the dielectric constant of the dielectric plate. Alternatively, the antenna unit satisfies the relation of $0.8(3\lambda)/(4\ \epsilon r^{1/2})\ d\ 1.2(3\lambda)/(4\ \epsilon r^{1/2})$, assuming that d represents the thickness of the dielectric plate and $\epsilon r$ represents the dielectric constant of the dielectric plate.

According to still another mode of the present invention, the dielectric plate has a protrusion protruding to approach the antenna on a portion opposed to the antenna.

Preferably, the dielectric layer is interposed between the protrusion and the antenna.

According to a further mode of the present invention, the protrusion has a columnar shape. Alternatively, the protrusion has a square pole shape.

According to a further mode of the present invention, the antenna is a microstrip patch antenna or a slot antenna.

Preferably, the antenna unit has a plurality of antennas. The plurality of antennas operate as phased-array antennas.

An electric apparatus according to a first aspect of the present invention includes the antenna unit described in any of the above, and has a housing storing the substrate. The dielectric plate partially constitutes the housing.

An electric apparatus according to a second aspect of the present invention includes a receiver and a transmitter used indoors respectively, and each of the receiver and the transmitter includes the antenna unit described in any of the above. The transmitter transmits a high-frequency signal to the receiver through an indoor wall.

Preferably in the antenna unit provided on the aforementioned electric apparatus, a light-emitting portion is provided on the major surface of the substrate. The light-emitting portion emits light toward the dielectric plate. The dielectric plate transmits the light emitted by the light-emitting portion.

According to the present invention, the gain and the radiation efficiency of the antenna can be improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 16 illustrates results of analysis of the antenna unit, including a dielectric plate having columnar protrusions, according to the second embodiment;

FIG. 17 illustrates results of analysis of the antenna unit, including the dielectric plate having square pole protrusions, according to the modification of the second embodiment;

DESCRIPTION OF THE PREFERRED EMBODIMENTS

An antenna unit 100 according to a first embodiment of the present invention is now described with reference to FIGS. 1 to 7. In the following description of embodiments, identical or corresponding portions are denoted by the same reference signs, and redundant description is not repeated.

(First Embodiment)

Figure 1:
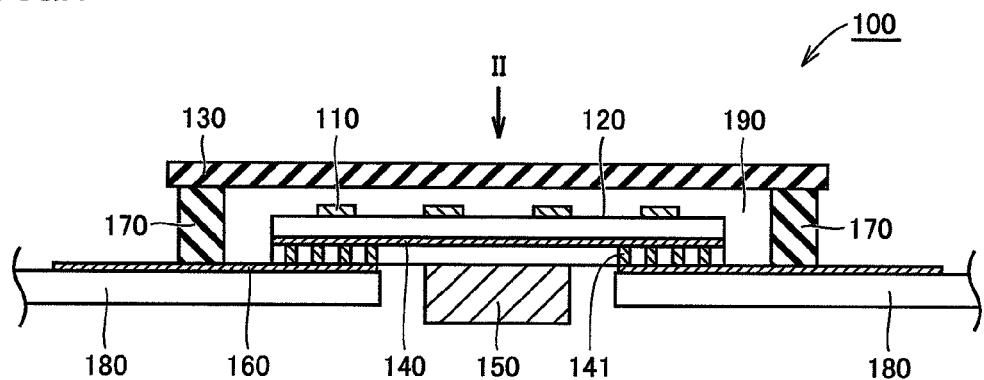
FIG. 1 is a sectional view showing the structure of an antenna unit according to a first embodiment of the present invention.
Figure 2:
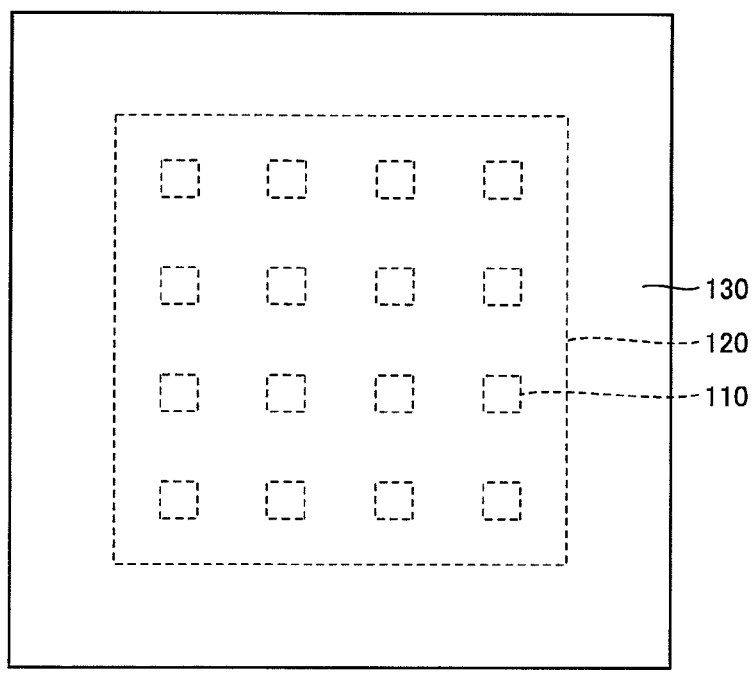
FIG. 2 is a plan view of the antenna unit as viewed along arrow II in FIG. 1.
Figure 3:
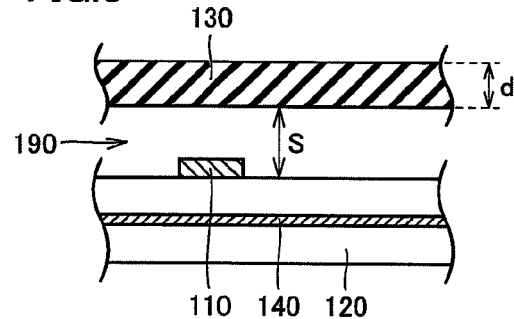
FIG. 3 is a sectional view showing the antenna unit according to the first embodiment in a partially enlarged manner.

FIG. 1 is a sectional view showing the structure of antenna unit 100 according to the first embodiment of the present invention. FIG. 2 is a plan view of antenna unit 100 as viewed along arrow II in FIG. 1. FIG. 3 is a sectional view showing antenna unit 100 according to the first embodiment in a partially enlarged manner.

As shown in FIGS. 1 and 2, a plurality of antennas 110 are formed on the upper major surface of a circuit board 120 in antenna unit 100 according to the first embodiment. According to the first embodiment, circuit board 120 is formed by a ceramic substrate.

Plurality of antennas 110 are arranged in the form of a lattice at intervals. According to the first embodiment, each antenna 110 is a microstrip patch antenna radiating a signal having a frequency of at least 59 GHz and not more than 62 GHz. Antenna 110 is not restricted to the microstrip patch antenna, but may alternatively be formed by another antenna such as a slot antenna.

Each of the microstrip patch antenna and the slot antenna can be formed on a substrate. When a multilayer substrate is employed, therefore, the antenna and a high-frequency circuit can be integrally constituted. Therefore, the radiation efficiency can be improved by reducing coupling loss of the antenna and the circuit, and antenna unit 100 can be formed as a miniature module.

A grounding conductor 140 made of a conductive material is provided on a central portion of circuit board 120 in the thickness direction, and linked to the lower major surface of circuit board 120 through contacts 141. A high-frequency IC (integrated circuit) chip 150 is mounted on the lower major surface of circuit board 120.

Circuit board 120 is so placed on a support substrate 180 that the lower major surface thereof is partially in contact with the upper surface of support substrate 180. A grounding conductor 160 is provided on the upper surface of support substrate 180. Grounding conductor 160 is connected to contacts 141 exposed on the lower major surface of circuit board 120. Circuit board 120 is stored in a housing (not shown).

A dielectric plate 130 is arranged to be opposed to the major surface of circuit board 120 provided with antennas 110. According to the first embodiment, polypropylene is employed as the material for dielectric plate 130. A sidewall portion 170 supports the periphery of the lower surface of dielectric plate 130.

A dielectric layer 190 is formed between circuit board 120 and dielectric plate 130. Dielectric layer 190, constituted of air according to the first embodiment, may alternatively be constituted of another gas such as nitrogen. Further alternatively, dielectric layer 190 may be constituted of resin having a dielectric constant lower than that of dielectric plate 130, as described later.

As shown in FIG. 3, a clearance of a distance S is present between the major surface of circuit board 120 provided with antennas 110 and the lower surface of dielectric plate 130, which are opposed to each other. Dielectric layer 190 is constituted of the air present in this clearance.

Dielectric plate 130 has a thickness d and a dielectric constant $\epsilon r$. According to the first embodiment, the dielectric constant $\epsilon r$ of dielectric plate 130 constituted of polypropylene is 2.3. The dielectric constant of circuit board 120 formed by the ceramic substrate is 7.5. It is assumed that the dielectric constant of the air is 1. Therefore, the dielectric constant $\epsilon r$ of dielectric plate 130 is smaller than that of circuit board 120. Dielectric layer 190 has a dielectric constant smaller than the dielectric constant $\epsilon r$ of dielectric plate 130.

In antenna unit 100 having the aforementioned structure, relative gains $\Delta dB$ of antennas 110 in a case of varying the thicknesses S and d of dielectric layer 190 and dielectric plate 130 were analyzed by an electromagnetic field simulation. The thickness of antennas 110 is sufficiently small as compared with the distance between the major surface of circuit board 120 and dielectric plate 130, and hence it is assumed that the thickness of dielectric layer 190 is substantially S.

Figure 4:
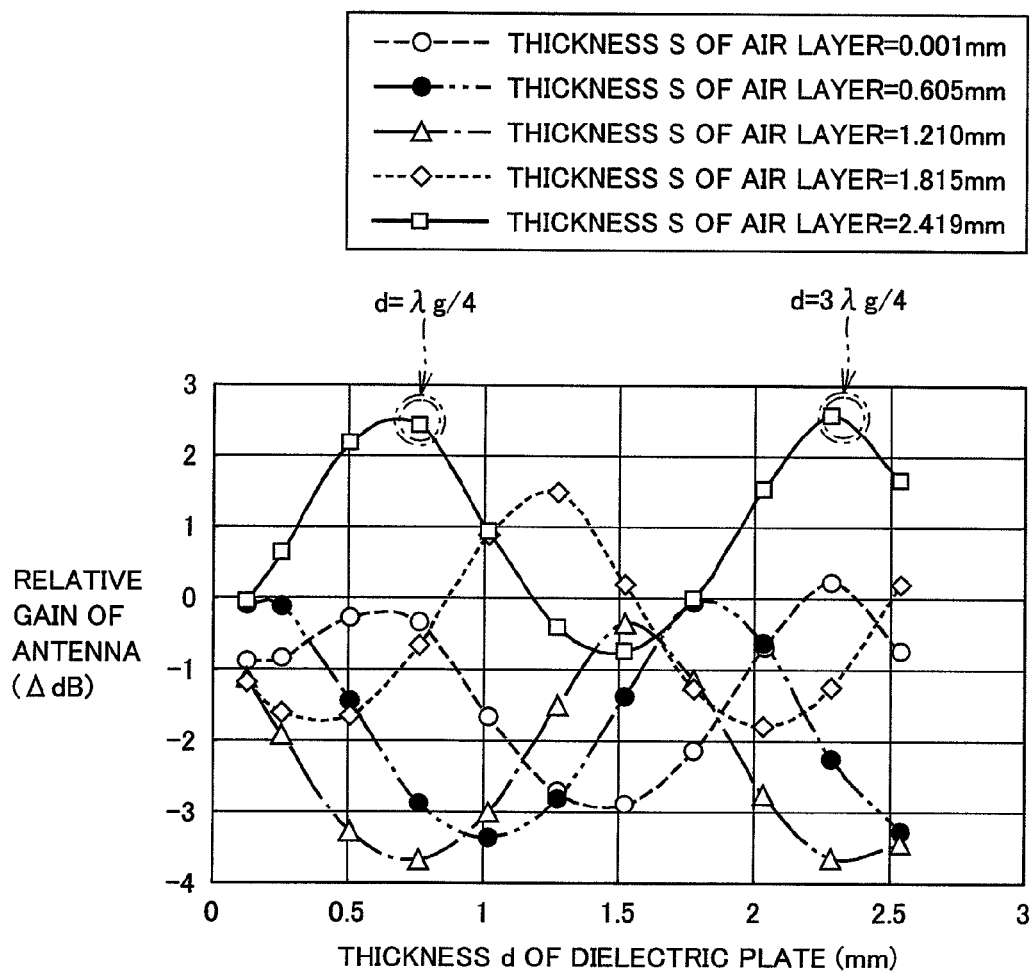
FIG. 4 illustrates results of analysis by an electromagnetic field simulation.

FIG. 4 is a diagram showing the results of the analysis by the electromagnetic field simulation. Referring to FIG. 4, the axis of ordinates shows the relative gains $\Delta dB$ of antennas 110, and the axis of abscissas shows the thickness d (mm) of dielectric plate 130. As to the relative gains $\Delta dB$ of antennas 110, it is assumed that the gain of antennas 110 of antenna unit 100 in a state not provided with dielectric plate 130 and dielectric layer 190 is 0 dB.

FIG. 4 shows data in cases where the thickness S of dielectric layer 190 is 2.419 mm, 1.815 mm, 1.210 mm, 0.605 mm and 0.001 mm with a solid line, a dotted line at a short pitch, a one-dot chain line, a two-dot chain line and a dotted line at a long pitch respectively.

As shown in FIG. 4, the relative gain $\Delta dB$ of antennas 110 is the largest when the thickness S of dielectric layer 190 is 2.419 mm. High-frequency signals emitted from antenna unit 100 according to the first embodiment are propagated in the air at a speed of three hundred thousand km per second, and hence the wavelength λ (mm) of the high-frequency signals propagated in the air is 30/60.5=4.95 mm, assuming that the average frequency of the high-frequency signals is 60.5 GHz. Therefore, it is understood that the relative gain ΔdB of antennas 110 is maximized when the thickness S of dielectric layer 190 is around λ/2.

The relative gain ΔdB of antennas 110 has periodicity with respect to the thickness d of dielectric plate 130. The effective wavelength λg of the high-frequency signals propagated in dielectric plate 130 is $\lambda/\epsilon r^{1/2}=4.95/2.3^{1/2}=3.26$. When the thickness d of dielectric plate 130 is odd natural number times as large as λg/4 indicating the positions enclosed with circles of two-dot chain lines in FIG. 4 in the case where dielectric layer 190 has the thickness S of 2.419 mm maximizing the relative gain ΔdB of antennas 110, antennas 110 exhibit high relative gains ΔdB. More specifically, antennas 110 exhibit high relative gains ΔdB when the thickness d of dielectric plate 130 is around λg/4=3.26/4=0.8 and around 3 λg/4=2.4 respectively.

Thus, while the relative gain ΔdB of antennas 110 reaches the peak value every time the thickness d of dielectric plate 130 changes by λg/2, dielectric loss is caused as the thickness d of dielectric plate 130 is increased, and the peak value of the relative gain ΔdB of antennas 110 is reduced.

Then, changes of the relative gain ΔdB of antennas 110 in a case of varying the thickness S of dielectric layer 190 while fixing the thickness d of dielectric plate 130 to 0.7 mm were analyzed by an electromagnetic field simulation.

Figure 5:
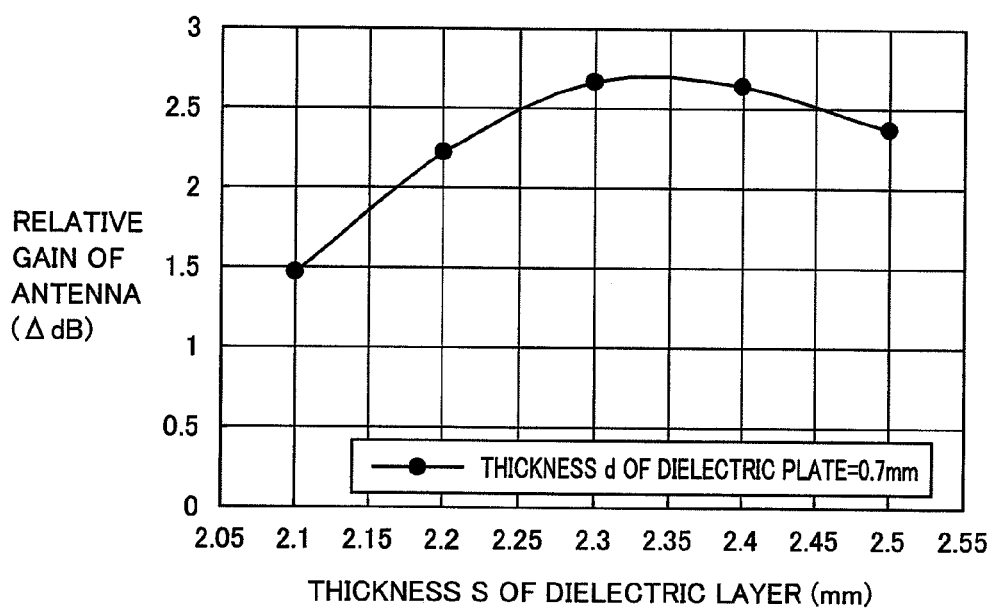
FIG. 5 illustrates results of analysis by an electromagnetic field simulation under a condition of setting the thickness of a dielectric plate to a constant value.

FIG. 5 illustrates the results of the analysis by the electromagnetic field simulation under the condition of setting the thickness d of dielectric plate 130 to the constant value. Referring to FIG. 5, the axis of ordinates shows the relative gain ΔdB of antennas 110, and the axis of abscissas shows the thickness S (mm) of dielectric layer 190. As to the relative gain ΔdB of antennas 110, it is assumed that the gain of antenna unit 100 in the state not provided with dielectric plate 130 and dielectric layer 190 is 0 dB.

As shown in FIG. 5, the relative gain ΔdB of antennas 110 reaches the peak value of about 2.7 dB when the thickness S of dielectric layer 190 is 2.4 mm, i.e., around λ/2. This is because the thickness S of dielectric layer 190 is around the half wavelength of the high-frequency signals and hence signals reflected on the lower surface of dielectric plate 130 to reach the major surface of circuit board 120 and those radiated from antennas 110 resonate in phase with each other. This operation does not directly depend on the dielectric constant of circuit board 120.

When the thickness S of dielectric layer 190 is in the range of at least 2.2 mm and not more than 2.5 mm, the relative gain ΔdB of antennas 110 is at least 2.1 dB, and loosely changes in this range.

When antenna unit 100 is so designed that the thickness S of dielectric layer 190 is at least 2.2 mm and not more than 2.5 mm so that the relative gain ΔdB of antennas 110 is at least 2.1 dB, therefore, the dimensional accuracy of components related to the thickness S of dielectric layer 190 may not be so strictly controlled due to the tolerance of 0.3 mm, and hence these components can be easily manufactured. As shown in FIG. 4, the relative gain ΔdB of antennas 110 is greater by at least 1 dB in the case where the thickness S of dielectric layer 190 is 1.815 mm. The thickness S of 1.815 mm is −30% of 2.475 mm corresponding to λ/2, and hence it is understood that the gain of antennas 110 can be improved when the thickness S of dielectric layer 190 is in the range of ±30% of λ/2, including the range of +30% of λ/2, due to the periodicity of the relative gain ΔdB of antennas 110. When the thickness S of dielectric layer 190 satisfies the relation of 0.7 λ/2≤S≤1.3 λ/2, therefore, the gain of antennas 110 can be improved.

As shown in FIG. 4, the relative gain ΔdB of antennas 110 is at least 0 3 dB when the thickness S of dielectric layer 190 is 2.419 mm and the thickness d of dielectric plate 130 is at least 0.3 mm and not more than 1.3 mm. The thickness d of 0.3 mm is −60% of 0.8 mm corresponding to λg/4, and the thickness d of 1.3 mm is +60% of 0.8 mm. Therefore, it is understood that the gain of antennas 110 can be improved when the thickness d of dielectric plate 130 is in the range of ±60% of λg/4. In other words, the gain of antennas 110 can be improved when the thickness d of dielectric plate 130 satisfies the relation of 0.4 λ/(4 $\epsilon r^{1/2}$)≤d≤1.6 λ/(4 $\epsilon r^{1/2}$).

As understood from FIG. 4, the thickness d of dielectric plate 130 allowing improvement of the gain of antennas 110 is about 1 mm as to each range. In other words, the gain of antennas 110 is improved periodically in the range of about 1 mm, when the thickness d of dielectric plate 130 is in the range of at least 0.3 mm and not more than 1.3 mm and in the range of at least 1.9 mm and not more than 2.9 mm.

Therefore, the gain of antennas 110 can be improved when the thickness d of dielectric plate 130 is in the range of ±20% of 3 λg/4. In other words, the gain of antennas 110 can be improved when the thickness d of dielectric plate 130 satisfies the relation of 0.8(3 λ)/(4 $\epsilon r^{1/2}$)≤d≤1.2(3 λ)/(4 $\epsilon r^{1/2}$).

Similarly, the gain of antennas 110 can be improved when the thickness d of dielectric plate 130 is in the range of ±12% of 5 λg/4. In other words, the gain of antennas 110 can be improved when the thickness d of dielectric plate 130 satisfies the relation of 0.88(5 λ)/(4 $\epsilon r^{1/2}$)≤d≤1.12(5 λ)/(4 $\epsilon r^{1/2}$).

Further similarly, the gain of antennas 110 can be improved when the thickness d of dielectric plate 130 is in the range of ±8% of 7 λg/4. In other words, the gain of antennas 110 can be improved when the thickness d of dielectric plate 130 satisfies the relation of 0.92(7 λ)/(4 $\epsilon r^{1/2}$)≤d≤1.08(7 λ)/(4 $\epsilon r^{1/2}$).

Thus, the thickness d of dielectric plate 130 is set to odd natural number times as large as a quarter effective wavelength of the high-frequency signals in dielectric plate 130 so that signals multiply reflected in dielectric plate 130 even times and those radiated from antennas 110 and propagated in dielectric layer 190 are in phase with each other on the boundary surface between dielectric plate 130 and dielectric layer 190, whereby the resonance effect in aforementioned dielectric layer 190 can be improved.

However, the tolerance for the thickness d of dielectric plate 130 is reduced as the thickness d is increased, and hence the thickness d of dielectric plate 130 is preferably reduced in order to control the dimensional accuracy of the components in manufacturing. More specifically, the thickness d of dielectric plate 130 is preferably set to $\lambda/4\epsilon r^{1/2}$.

Figure 6:
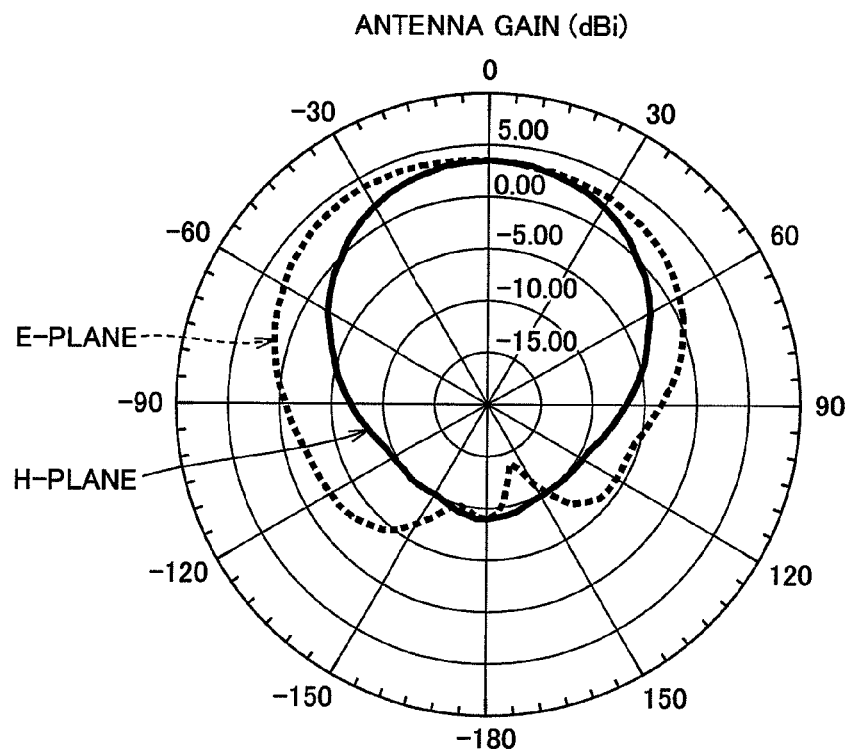
FIG. 6 illustrates the radiation pattern of an antenna in an antenna unit provided with neither a dielectric layer nor a dielectric plate according to comparative example.
Figure 7:
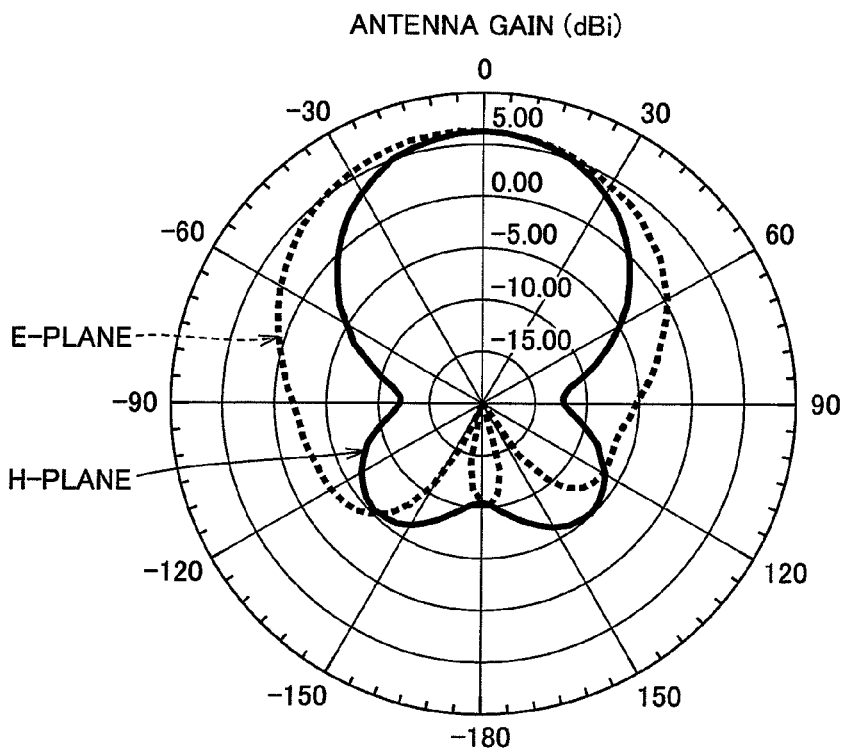
FIG. 7 illustrates the radiation pattern of an antenna in the antenna unit according to the first embodiment.

In antenna unit 100 having the aforementioned structure, directivity per antenna 110 was evaluated. FIG. 6 illustrates the radiation pattern of an antenna in an antenna unit provided with neither a dielectric layer nor a dielectric plate according to comparative example. FIG. 7 illustrates the radiation pattern of each antenna 110 in antenna unit 100 according to the first embodiment.

As shown in FIG. 6, the antenna gain (dBi) in a 0° direction is 4 dBi on an H-plane (vertical plane) and an E-plane (horizontal plane) in the antenna of the antenna unit according to comparative example. As shown in FIG. 7, the antenna gain (dBi) in a 0° direction is 6.5 dBi on an H-plane and an E-plane in each antenna 110 of antenna unit 100 according to the first embodiment. Thus, the antenna gain (dBi) is improved by about 2.5 dBi in the 0° direction on the H-plane and the E-plane, due to the provision of dielectric layer 190 and dielectric plate 130.

Comparing FIGS. 6 and 7 with each other, it is understood that the radiation pattern of antenna 110 of antenna unit 100 according to the first embodiment has stronger directivity than the radiation pattern of the antenna of the antenna unit according to comparative example, and is sharper with respect to the 0° direction on the H-plane and the E-plane.

In antenna unit 100 according to the first embodiment, the dielectric constant ∈r of dielectric plate 130 made of polypropylene is 2.3. In other words, the dielectric constant ∈r of dielectric plate 130 is at a value intermediate between the dielectric constant (1) of the air around antenna unit 100 and that (7.5) of circuit board 120 formed by a ceramic substrate and closer to the dielectric constant of air.

Therefore, dielectric plate 130 functions as a buffer layer against the high-frequency signals radiated from antennas 110, and improves consistency between antenna unit 100 and the air around the same. Thus, the radiation efficiency of the high-frequency signals from antenna unit 100 and the antenna gain are improved. Further, circuit board 120 has a high dielectric constant, so that antenna unit 100 can be downsized by reducing the sizes of circuits.

However, the materials for dielectric plate 130 and circuit board 120 are not restricted to polypropylene and ceramic respectively. The materials for dielectric plate 130, dielectric layer 190 and circuit board 120 may simply be so selected that the dielectric constant ∈r of dielectric plate 130 is not more than that of circuit board 120 and the dielectric constant of dielectric layer 190 is smaller than that of dielectric plate 130.

An electric circuit controls the phases of the high-frequency signals radiated from plurality of antennas 110 provided on antenna unit 100 according to the first embodiment respectively and synthesizes the high-frequency signals, so that antennas 110 operate as turnable and vertically movable phased-array antennas. While plurality of antennas 110 are formed to operate as the phased-array antennas in the first embodiment, antenna unit 100 may alternatively be provided with one or a plurality of antennas radiating high-frequency signals whose phases are not controlled.

According to the first embodiment, plurality of antennas 110 so operate as the phased-array antennas that the scanning zone of a main beam is limited to ±several 10 degrees and the gain of the main beam in the scanning zone is improved. As shown in FIG. 7, an antenna gain of at least 5 dBi is obtained on the H-plane in the range of ±20°. The effect of improving the antenna gain (dBi) depends on the number of antennas 110, and hence the antenna gain (dBi) can be increased as the number of antennas 110 is increased.

An antenna unit according to a second embodiment of the present invention is now described.

(Second Embodiment)

Figure 8:
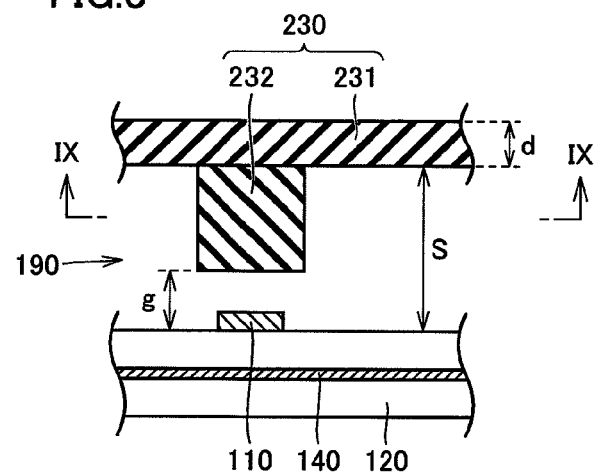
FIG. 8 is a sectional view showing an antenna unit according to a second embodiment of the present invention in a partially enlarged manner.
Figure 9:
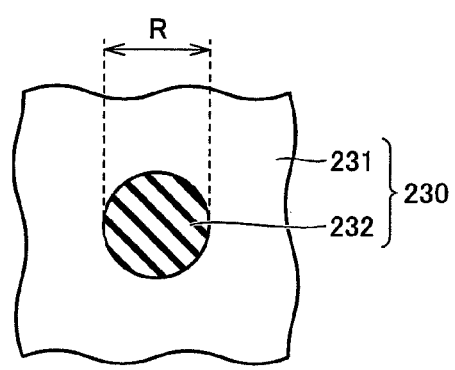
FIG. 9 is a sectional view of the antenna unit taken along the line IX-IX in FIG. 8.

FIG. 8 is a sectional view showing the antenna unit according to the second embodiment of the present invention in a partially enlarged manner. FIG. 9 is a sectional view of the antenna unit taken along the line IX-IX in FIG. 8.

In the antenna unit according to the second embodiment, a dielectric plate 230 is constituted of a flat plate portion 231 and a protrusion 232, as shown in FIGS. 8 and 9. The remaining structure of the antenna unit according to the second embodiment is similar to that of antenna unit 100 according to the first embodiment, and hence redundant description is not repeated.

As shown in FIG. 8, protrusion 232 protrudes to approach an antenna 110 in a portion of flat plate portion 231 opposed to antenna 110. According to the second embodiment, flat plate portion 231 and protrusion 232 are integrally made of polypropylene. However, flat plate portion 231 and protrusion 232 may alternatively be made of materials having different dielectric constants respectively.

As shown in FIG. 9, protrusion 232 is in the form of a column having a circular section of a diameter R. The diameter R may be so set that a region of protrusion 232 projected onto a circuit board 120 from above includes antenna 110.

As shown in FIG. 8, a clearance of a distance S is present between the major surface of circuit board 120 and the lower surface of flat plate portion 231. Air is present in this clearance, to constitute a dielectric layer 190.

According to the second embodiment, dielectric layer 190 is interposed between protrusion 232 and antenna 110. In other words, a gap g larger than the thickness of antenna 110 is formed between the major surface of circuit board 120 and the lower surface of protrusion 232.

Figure 10:
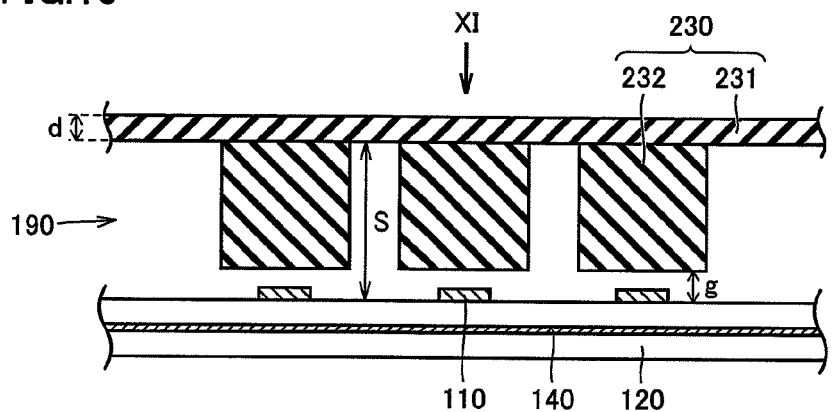
FIG. 10 is a sectional view showing the structure of the antenna unit, provided with protrusions correspondingly to a plurality of antennas, according to the second embodiment.
Figure 11:
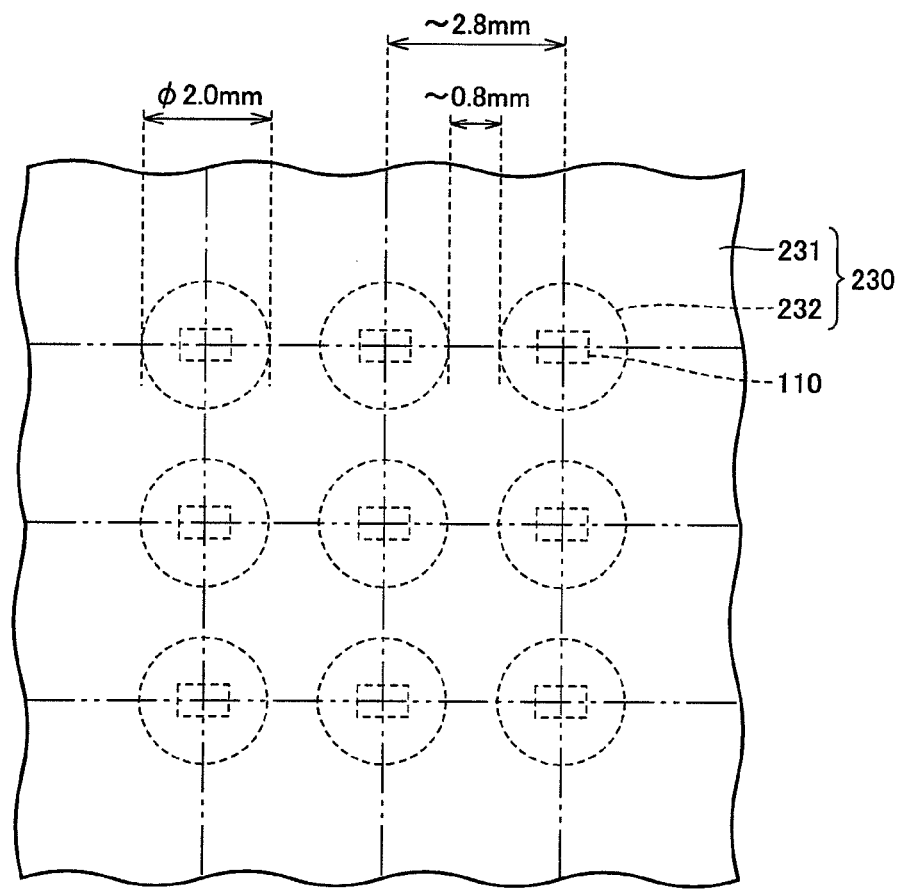
FIG. 11 is a plan view of the antenna unit as viewed along arrow XI in FIG. 10.

FIG. 10 is a sectional view showing the structure of the antenna unit, provided with protrusions 232 correspondingly to a plurality of antennas 110, according to the second embodiment. FIG. 11 is a plan view of the antenna unit as viewed along arrow XI in FIG. 10.

As shown in FIGS. 10 and 11, protrusions 232 are provided on the lower surface of flat plate portion 231 correspondingly to the positions provided with plurality of antennas 110 in the antenna unit according to the second embodiment. When each adjacent pair of antennas 110 are formed at an interval of not more than 2.8 mm, for example, columnar protrusions 232 of 2.0 mm in diameter are so provided that the interval between each adjacent pair of protrusions 232 is not more than 0.8 mm.

While each protrusion 232 has a columnar shape in the second embodiment, the shape of protrusion 232 is not restricted to this, but may alternatively be a pillar shape having an elliptical section or the like.

Figure 12:
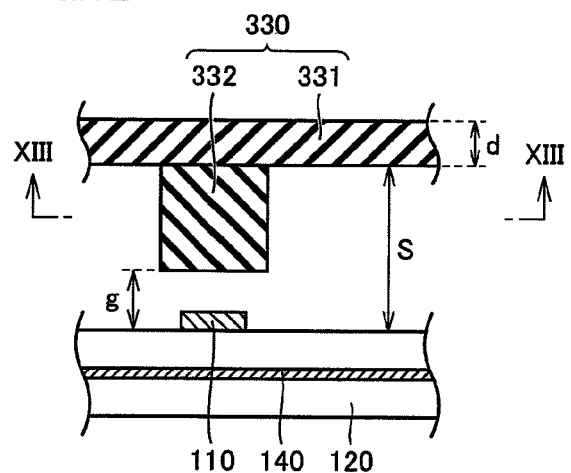
FIG. 12 is a sectional view showing an antenna unit, including a dielectric plate having a square pole protrusion, according to a modification of the second embodiment in a partially enlarged manner.
Figure 13:
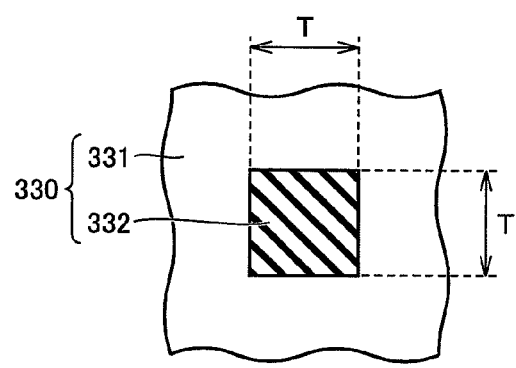
FIG. 13 is a sectional view of the antenna unit taken along the line XIII-XIII in FIG. 12.

FIG. 12 is a sectional view showing an antenna unit, including a dielectric plate 330 having a square pole protrusion 332, according to a modification of the second embodiment in a partially enlarged manner. FIG. 13 is a sectional view of the antenna unit taken along the line XIII-XIII in FIG. 12.

As shown in FIGS. 12 and 13, protrusion 332 protruding from a flat plate portion 331 is in the form of a square pole having a square section having a length T on each side in dielectric plate 330 of the antenna unit according to the modification of the second embodiment. The length T of each side of the square section may simply be so set that a region of protrusion 332 projected onto a circuit board 120 from above includes an antenna 110. Protrusion 332, having the square section in the modification of the second embodiment, may alternatively have a rectangular section.

Figure 14:
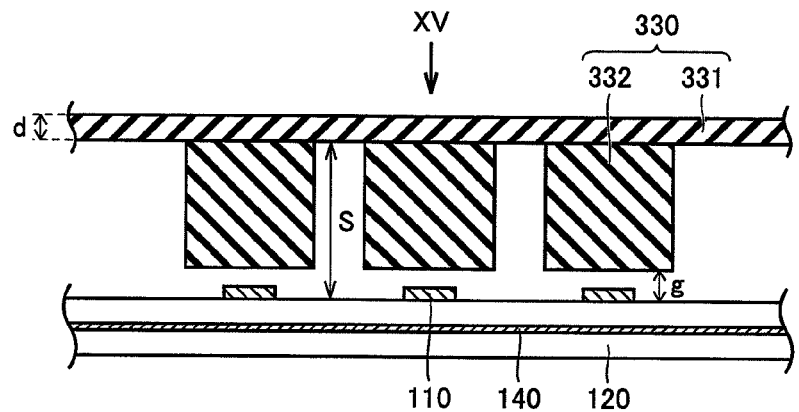
FIG. 14 is a sectional view showing the structure of the antenna unit, provided with protrusions correspondingly to a plurality of antennas, according to the modification of the second embodiment.
Figure 15:
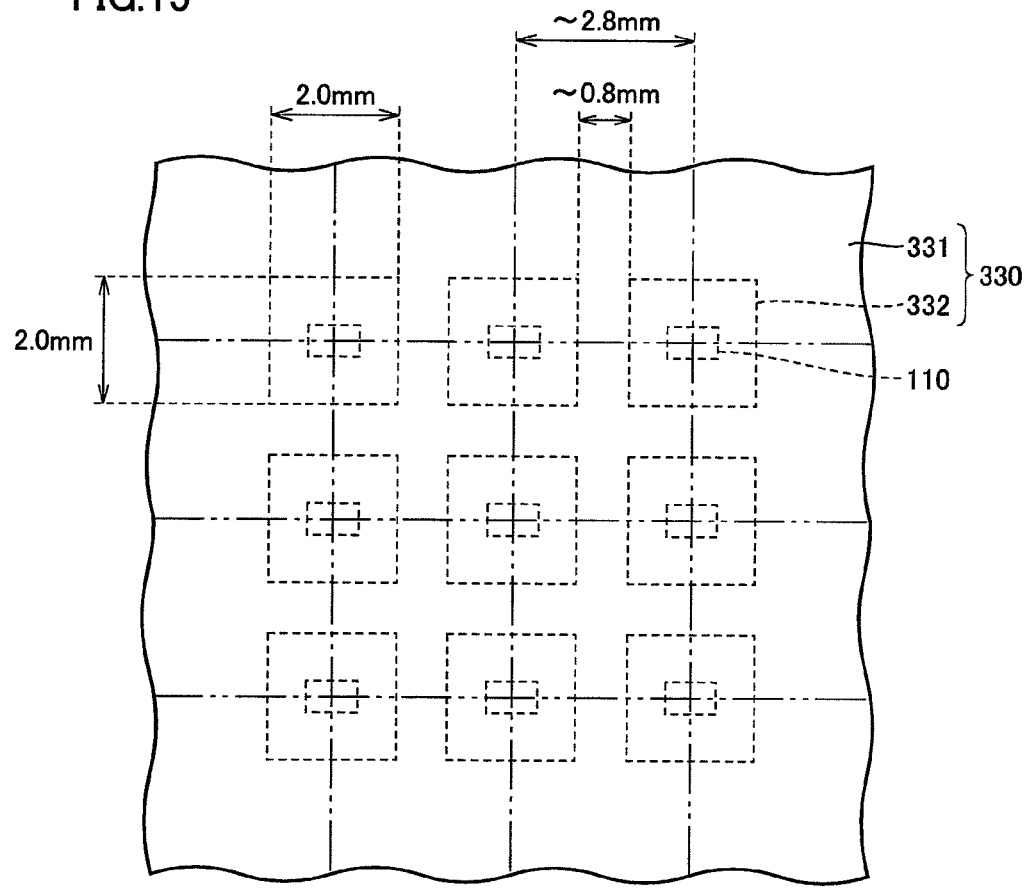
FIG. 15 is a plan view of the antenna unit according to the modification of the second embodiment as viewed along arrow XV in FIG. 14.

FIG. 14 is a sectional view showing the structure of the antenna unit, provided with protrusions 332 correspondingly to a plurality of antennas 110, according to the modification of the second embodiment. FIG. 15 is a plan view of the antenna unit according to the modification as viewed along arrow XV in FIG. 14.

As shown in FIGS. 14 and 15, protrusions 332 are provided on the lower surface of flat plate portion 331 correspondingly to the positions provided with plurality of antennas 110 in the modification of the second embodiment. When each adjacent pair of antennas 110 are formed at an interval of not more than 2.8 mm, for example, protrusions 232 each having a square pole section of 2.0 mm on each side are so provided that the interval between each adjacent pair of protrusions 232 is not more than 0.8 mm.

In each of the antenna units having the aforementioned structures, the relation between the gain of each antenna 110 and the gap g was analyzed by an electromagnetic field simulation.

FIG. 16 illustrates the results of the analysis of the antenna unit including dielectric plate 230 having columnar protrusions 232 according to the second embodiment. FIG. 17 illustrates the results of the analysis of the antenna unit including dielectric plate 330 having square pole protrusions 332 according to the modification of the second embodiment. Referring to each of FIGS. 16 and 17, protrusions 232 or 332 and antennas 110 are in contact with each other when the gap g is 0 µm.

As shown in FIGS. 16 and 17, each of the antenna units including dielectric plates 230 and 330 having columnar and square pole protrusions 232 and 332 respectively obtains high antenna gains (dBi) when the gap g is 300 µm and 400 µm. The gap g of 400 µm corresponds to λg/8. It is assumed that the thickness of each antenna 110 is 20 µm.

Each of the antenna units including dielectric plates 230 and 330 having columnar and square pole protrusions 232 and 332 respectively has the antenna gain (dBi) higher than that of the antenna unit provided with neither a dielectric layer nor a dielectric plate shown in FIG. 6, when the gap g is 0 µm. Therefore, dielectric plates 230 and 330 may be so formed that the lower surfaces of protrusions 232 and 332 and the upper surfaces of antennas 110 are in contact with each other.

When dielectric plates 230 and 330 are so formed that the lower surfaces of protrusions 232 and 332 and the upper surfaces of antennas 110 are not in contact with each other, however, application of external force to antennas 110 through dielectric plates 230 and 330 can be suppressed. Consequently, circuit boards 120 can be prevented from being broken by the external force.

Figure 18:
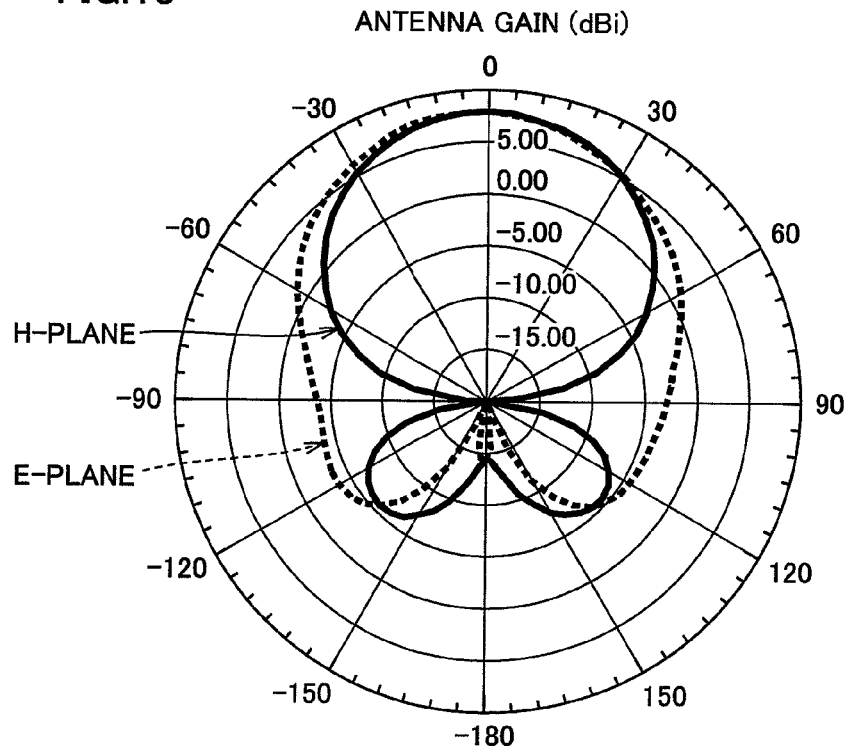
FIG. 18 illustrates the radiation pattern of each antenna of the antenna unit, including the dielectric plate having the columnar protrusions, according to the second embodiment.
Figure 19:
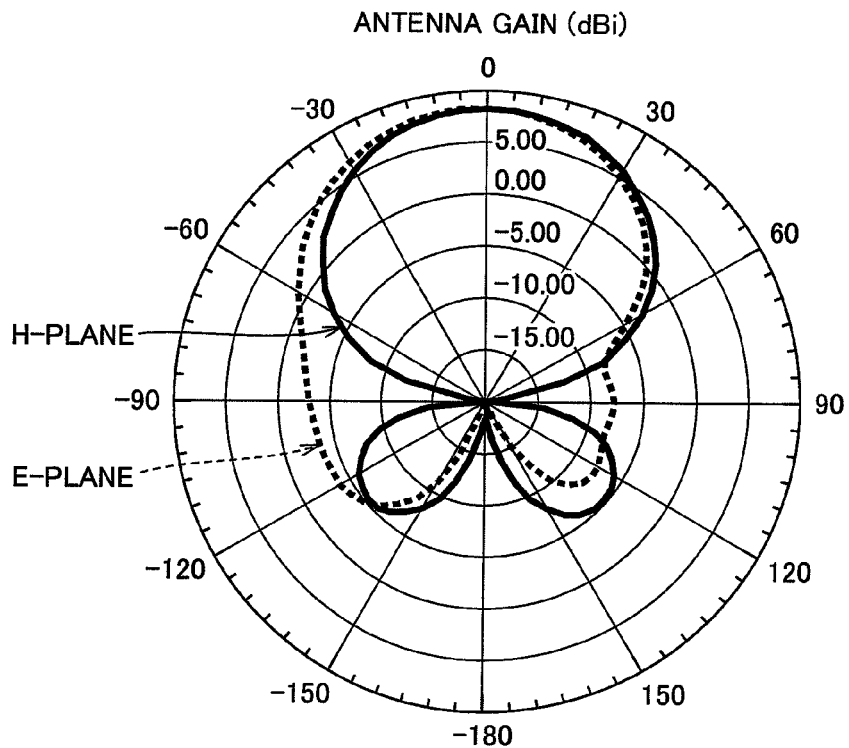
FIG. 19 illustrates the radiation pattern of each antenna of the antenna unit, including the dielectric plate having the square pole protrusions, according to the modification of the second embodiment.

In each of the antenna units according to the second embodiment and the modification thereof, directivity of each antenna 110 was evaluated while setting the gap g to 300 µm. FIG. 18 illustrates the radiation pattern of each antenna 110 of the antenna unit including dielectric plate 230 having columnar protrusions 232 according to the second embodiment. FIG. 19 illustrates the radiation pattern of each antenna 110 of the antenna unit including dielectric plate 330 having square pole protrusions 330 according to the modification of the second embodiment.

As shown in FIG. 18, antenna 110 of the antenna unit according to the second embodiment exhibits an antenna gain (dBi) of 8.0 dBi in a 0° direction on an H-plane and an E-plane. As shown in FIG. 19, antenna 110 of the antenna unit according to the modification of the second embodiment exhibits an antenna gain (dBi) of 8.6 dBi in a 0° direction on an H-plane and an E-plane.

As compared with antenna 110 of antenna unit 100 including flat dielectric plate 130 shown in FIG. 7, therefore, the antenna gain (dBi) is improved by 1 dB to 1.6 dB in antenna 110 of each of the antenna units including dielectric plates 230 and 330 having protrusions 232 and 332.

Comparing FIG. 7 and FIGS. 18 and 19 with each other, it is understood that the radiation pattern of antenna 110 of each of the antenna units according to the second embodiment and the modification thereof has stronger directivity than the radiation pattern of antenna 110 of antenna unit 100 according to the first embodiment, and is sharper with respect to the 0° direction on the H-plane and the E-plane. In particular, the radiation pattern exhibits a narrow main lobe on the E-plane.

Thus, in the antenna unit according to the second embodiment, the gain of a main beam can be improved, and the number of unnecessary reflected wave components resulting from spreading of the beam can be reduced due to narrowing of the beam.

According to the second embodiment and the modification thereof, flat plate portions 231 and 331 and protrusions 232 and 332 are made of the same material to integrally form dielectric plates 230 and 330. Therefore, dielectric plates 230 and 330 can be easily manufactured through molds, and the antenna units are excellent in mass productivity.

Figures 20, 21:
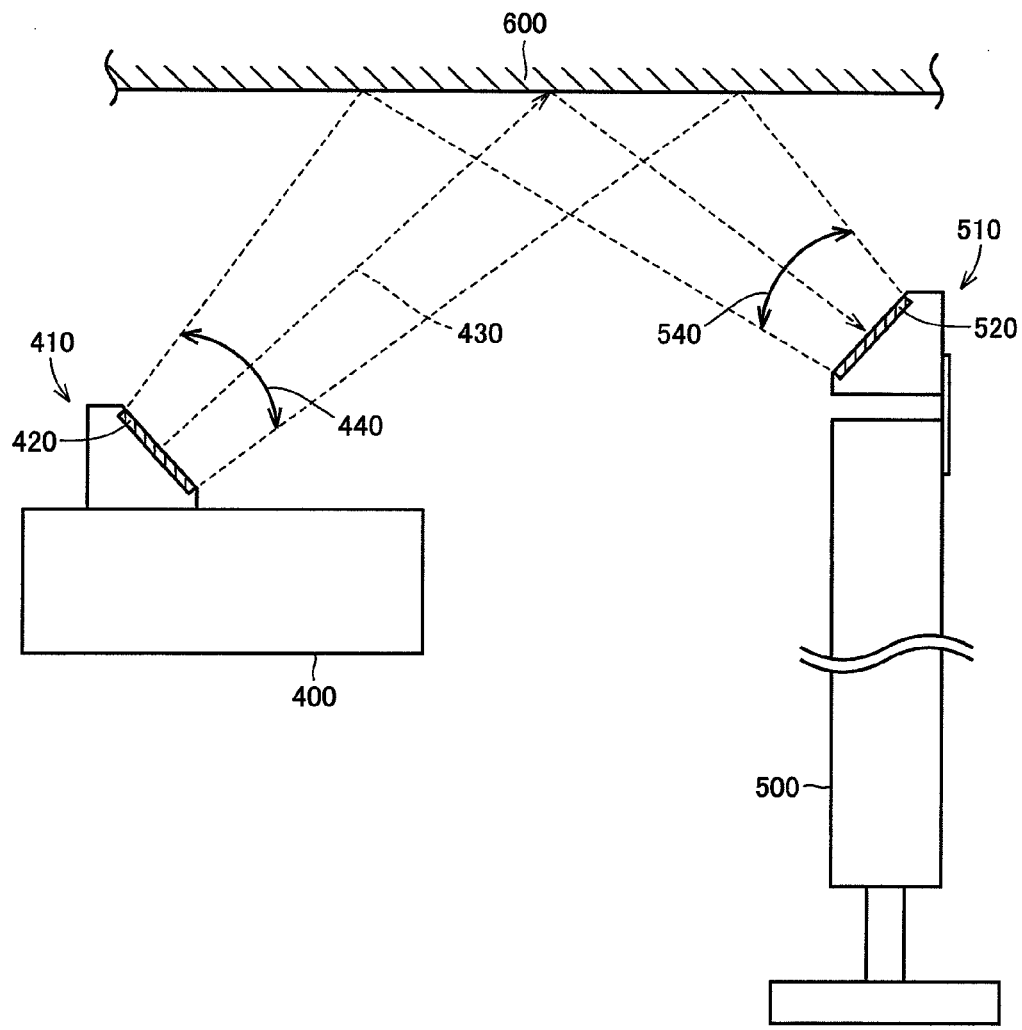
FIG. 20 collectively illustrates the gains (dBi) of an antenna unit provided with no dielectric plate, the antenna unit according to the second embodiment, the antenna unit according to the second embodiment and the antenna unit according to the modification of the second embodiment.
FIG. 21 is a schematic diagram showing a used mode of an electric apparatus according to a third embodiment of the present invention.

FIG. 20 collectively illustrates the antenna gains (dBi) of each antenna of the antenna unit provided with no dielectric plate, each antenna 110 of antenna unit 100 according to the first embodiment, each antenna 110 of the antenna unit according to the second embodiment and each antenna 110 of the antenna unit according to the modification of the second embodiment.

As shown in FIG. 20, antenna unit 100 having dielectric plate 130 according to the first embodiment and the antenna units having dielectric plates 230 and 330 according to the second embodiment and the modification thereof have higher antenna gains (dBi) than the antenna unit having no dielectric plate.

An electric apparatus including antenna unit 100 according to the first embodiment or the antenna unit according to the second embodiment is now described. While the electric apparatus according to the following embodiment performs radio transmission between AV (audiovisual) systems used indoors, the present invention is not restricted to this, but the electric apparatus also includes a transmitter-receiver for high-frequency signals used outdoors or the like.

(Third Embodiment)

Figure 22:
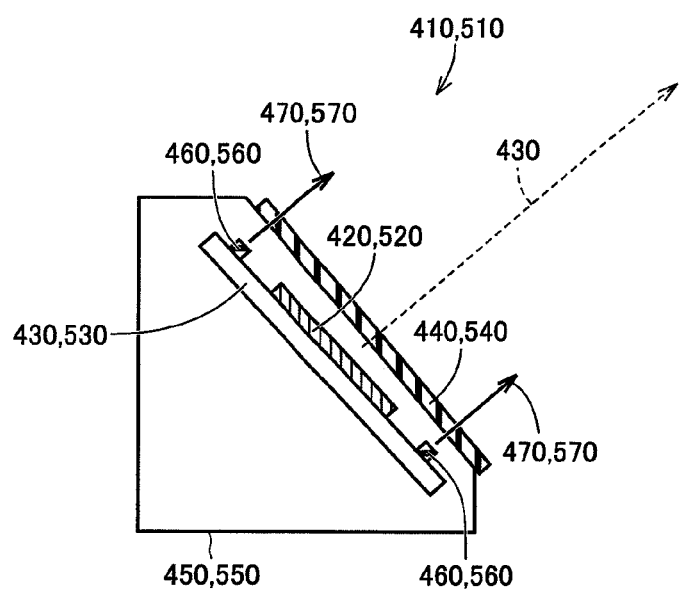
FIG. 22 is a sectional view showing the structure of the electric apparatus according to the third embodiment.

FIG. 21 is a schematic diagram showing a used mode of an electric apparatus according to a third embodiment of the present invention. FIG. 22 is a sectional view showing the structure of the electric apparatus according to the third embodiment.

As shown in FIG. 21, the electric apparatus according to the third embodiment is constituted of a transmitter 410 and a receiver 510 performing radio transmission between a Blu-ray and HDD (hard disk drive) recorder 400 and a television 500 used indoors.

Transmitter 410 is connected with Blu-ray and HDD recorder 400, which transmits a signal to transmitter 410. Receiver 510 is connected with television 500, and transmits a signal received therein to television 500.

In the electric apparatus according to the third embodiment, transmitter 410 transmits a high-frequency signal 430 to receiver 510 through an indoor wall. In general, television 500 is arranged along the wall, and Blu-ray and HDD recorder 400 is arranged on a table or the like close to the viewer. Therefore, an obstacle such as a human hindering transmission/receiving of high-frequency signal 430 may lie between Blu-ray and HDD recorder 400 and television 500.

In order to transmit/receive high-frequency signal 430 while reducing influence by the obstacle, transmitter 410 transmits high-frequency signal 430 toward the ceiling 600 and receiver 510 receives high-frequency signal 430 reflected by ceiling 600 in the electric apparatus according to the third embodiment. Such signal transmission is referred to as over-the-horizon transmission. On the other hand, an operation of transmitter 410 directly transmitting high-frequency signal 430 to receiver 510 is referred to as line-of-sight transmission.

Transmitter 410 and receiver 510 have phased-array antennas 420 and 520 respectively. Therefore, transmitter 410 transmits high-frequency signal 430 while scanning a range shown by arrow 440 in FIG. 21. Receiver 510 receives high-frequency signal 430 while scanning a range shown by arrow 540 in FIG. 21. Each of transmitter 410 and receiver 510 has a control portion (not shown), and is controlled by the control portion to transmit or receive high-frequency signal 430 on a most sensitive position in the scanning range.

More specifically, the control portion of receiver 510 transmits receiving sensitivity of high-frequency signal 430 as a feedback signal to transmitter 410. The control portion of transmitter 410 receives the feedback signal, and decides the optimum transmission path. After the optimum transmission path is decided, the control portions of transmitter 410 and receiver 510 adjust the directions of beams of respective antennas 420 and 520 to construct the optimum transmission path. Consequently, transmission loss between transmitter 410 and receiver 510 is reduced.

As shown in FIG. 22, antennas 420 and 520 are formed on the major surfaces of circuit boards 430 and 530 in transmitter 410 and receiver 510 of the electric apparatus according to the third embodiment. Circuit boards 430 and 530 are stored in housings 450 and 550 respectively. Dielectric plates 440 and 540 arranged to be opposed to circuit boards 430 and 530 partially constitute housings 450 and 550. High-frequency signal 430 is radiated from antennas 420 and 520, transmitted through dielectric plates 440 and 540, and propagated.

According to the third embodiment, light-emitting portions 460 and 560 formed by LEDs (light emitting diodes) are provided on the major surfaces of circuit boards 430 and 530 respectively. Light-emitting portions 460 and 560 emit visible rays 470 and 570 of red, green etc. toward dielectric plates 440 and 540. Dielectric plates 440 and 540 transmit visible rays 470 and 570 emitted by light-emitting portions 460 and 560.

According to the third embodiment, dielectric plates 440 and 540 are made of polypropylene, to have a dielectric constant εr of 2.3. Assuming that the average frequency of high-frequency signal 430 is 60.5 GHz, the effective wavelength λg of dielectric plates 440 and 540 is 3.26 mm. The thickness of dielectric plates 440 and 540 is preferably set to a value around λg/4=0.8 mm or 3 λg/4=2.4 mm, so that antennas 420 and 520 obtain high antenna gains (dBi).

Dielectric plates 440 and 540 are so formed by polypropylene plates having a thickness of about 0.8 mm or about 2.4 mm that visible rays 470 and 570 emitted by light-emitting portions 460 and 560 can be transmitted through dielectric plates 440 and 540.

When transmitter 410 and receiver 510 transmits and receives high-frequency signal 430, light-emitting portions 460 and 560 so emit visible rays 470 and 570 that the user of the electric apparatus can recognize that high-frequency signal 430 is transmitted and received. Consequently, the user can be so cautioned that no obstacle or the like is present in the transmission path between transmitter 410 and receiver 510.

In the electric apparatus according to the third embodiment, dielectric plates 440 and 540 partially forming housings 450 and 550 function as antenna covers. Therefore, dielectric plates 440 and 540 made of polypropylene are preferably formed not with the thickness of 0.8 mm but with the thickness of 2.4 mm, so that dielectric plates 440 and 540 are increased in mechanical strength and improved in protective function for antennas 420 and 520.

Further, dielectric plates 440 and 540 are preferably formed with the thickness of 2.4 mm so that the electric apparatus is excellent in weatherability and improved in durability when the same is used outdoors.

Although the present invention has been described and illustrated in detail, it is clearly understood that the same is by way of illustration and example only and is not to be taken by way of limitation, the scope of the present invention being interpreted by the terms of the appended claims.

What is claimed is:

1. An antenna unit comprising:
   a substrate;
   an antenna located on one major surface of said substrate;
   a dielectric plate opposed to said major surface of said substrate; and
   a dielectric layer interposed between said substrate and said dielectric plate, wherein
   said dielectric plate has a dielectric constant of not more than the dielectric constant of said substrate,
   said dielectric layer has a dielectric constant smaller than said dielectric constant of said dielectric plate,
   said dielectric layer is made of air, and
   the antenna unit satisfies the relation of $0.7\lambda/2 \leq S \leq 1.3\lambda/2$, assuming that $\lambda$ represents the wavelength of a high-frequency signal, radiated from said antenna, propagated in the air and S represents the distance between said major surface of said substrate and said dielectric plate opposed to each other.

2. The antenna unit according to claim 1, satisfying the relation of $0.4\lambda/(4\epsilon r^{1/2}) \leq d \leq 1.6\lambda/(4\epsilon r^{1/2})$, assuming that d represents the thickness of said dielectric plate and $\epsilon r$ represents said dielectric constant of said dielectric plate.

3. The antenna unit according to claim 1, satisfying the relation of $0.8(3\lambda)/(4\epsilon r^{1/2}) \leq d \leq 1.2(3\lambda)/(4\epsilon r^{1/2})$, assuming that d represents the thickness of said dielectric plate and $\epsilon r$ represents said dielectric constant of said dielectric plate.

4. The antenna unit according to claim 1, wherein
   said dielectric plate has a protrusion protruding to approach said antenna on a portion opposed to said antenna.

5. The antenna unit according to claim 4, wherein
   said dielectric layer is interposed between said protrusion and said antenna.

6. The antenna unit according to claim 4, wherein
   said protrusion has a columnar shape.

7. The antenna unit according to claim 4, wherein
   said protrusion has a square pole shape.

8. The antenna unit according to claim 1, wherein
   said antenna is a microstrip patch antenna or a slot antenna.

9. The antenna unit according to claim 1, having a plurality of said antennas, wherein
   said plurality of antennas operate as phased-array antennas.

10. An electric apparatus comprising the antenna unit according to claim 1, having a housing storing said substrate, wherein
    said dielectric plate partially constitutes said housing.

11. An electric apparatus comprising a receiver and a transmitter used indoors respectively, wherein
    each of said receiver and said transmitter includes the antenna unit according to claim 1, and
    said transmitter transmits a high-frequency signal to said receiver through an indoor wall.

12. The electric apparatus according to claim 10, wherein
    a light-emitting portion is provided on said major surface of said substrate in said antenna unit,
    said light-emitting portion emits light toward said dielectric plate, and
    said dielectric plate transmits said light emitted by said light-emitting portion.

13. The electric apparatus according to claim 11, wherein
    a light-emitting portion is provided on said major surface of said substrate in said antenna unit, said light-emitting portion emits light toward said dielectric plate, and said dielectric plate transmits said light emitted by said light-emitting portion.

* * * * *